(12) United States Patent
Tostengard

(10) Patent No.: US 9,333,579 B1
(45) Date of Patent: May 10, 2016

(54) SOLDERING IRON ARMS

(71) Applicant: Erik J Tostengard, Hayden, ID (US)

(72) Inventor: Erik J Tostengard, Hayden, ID (US)

(*) Notice: Subject to any disclaimer, the term of this patent is extended or adjusted under 35 U.S.C. 154(b) by 0 days.

(21) Appl. No.: 14/642,751

(22) Filed: Mar. 10, 2015

(51) Int. Cl.
*B23K 3/00* (2006.01)
*B23K 3/02* (2006.01)
*B23K 3/03* (2006.01)
*H05K 13/04* (2006.01)

(52) U.S. Cl.
CPC . *B23K 3/027* (2013.01); *B23K 3/02* (2013.01); *B23K 3/025* (2013.01); *B23K 3/033* (2013.01); *B23K 3/0346* (2013.01); *H05K 13/0491* (2013.01)

(58) Field of Classification Search
CPC .......... B23K 3/025; B23K 3/027; B23K 3/00; B23K 3/02; H05K 13/0491
USPC .......................................................... 228/51
See application file for complete search history.

(56) References Cited

U.S. PATENT DOCUMENTS

| | | | |
|---|---|---|---|
| 1,332,937 A | 3/1920 | Van Vierson | |
| 4,415,116 A * | 11/1983 | Norton | B23K 3/02 219/230 |
| 4,591,696 A | 5/1986 | Eisen | |
| 4,896,019 A * | 1/1990 | Hyun | B23K 3/025 219/228 |
| 5,427,057 A * | 6/1995 | Hattori | C03B 13/285 117/220 |
| 2011/0139854 A1 | 6/2011 | Custer | |

* cited by examiner

*Primary Examiner* — Erin Saad
(74) *Attorney, Agent, or Firm* — John Chandler

(57) ABSTRACT

Arms serve as utility accessories to a tip of a soldering iron or a soldering gun. Preferably, the arms are held in a substantially fixed orientation relative to the heated tip or working end of the soldering device. Components are placed against the heating element and held in place by working ends such as clamp-like or tapered claws, jaws or forks on ends of the arms or rods. This arrangement allows the operator to hold the soldering device in one hand and to apply solder while the components remain fixed to the heating element or tip. Arms may be attached to a conventional soldering device or may be integrated with soldering device components to create a new form of soldering device for manual use. Arms serve as a safety mechanism to prevent a hot soldering tip from needlessly contacting proximate surfaces and encourages heat transfer to components receiving solder.

18 Claims, 7 Drawing Sheets

SOLDERING IRON ARMS

BACKGROUND

1. Field

The present invention relates generally to soldering devices such as soldering irons and soldering guns, and more particularly, to arms, legs, clamps, handles, rests, holders and accessory components for attaching to handheld soldering devices for facilitating soldering of wires, electronic components and the like.

2. Related Art

Soldering is performed by briefly applying heat to a metal alloy, known as solder, until it reaches a liquid state. Solder is often a lead and tin alloy with a relatively low melting point that can be readily liquefied. Liquid solder is applied at a desired location with the assistance of a heat source like a soldering iron or soldering gun. After removal of a heat source, the liquid metal cools and returns to a solid state. Solder helps to form a required electrical connection, to secure a component to a lead or circuit board, or to secure two or more components together.

Technicians do not always have the luxury of using a soldering iron in a controlled environment such as on a workbench. Instead, some soldering jobs must be done in an awkward or confined location such as in vehicle while installing electronic equipment or during a home repair in or near a basement, ceiling, wall, floor or garage where the components to be soldered cannot be easily accessed for soldering. In these circumstances, a hot soldering iron can be a fire hazard and burn threat, and often can slide or roll around when the soldering iron is in the shape of a substantially round barrel. Accordingly, a hot or heat-bearing soldering iron must be handled with care in these circumstances.

In use, it is often awkward to position two or more components and simultaneously apply the tip of the soldering iron to the components, and then apply fresh solder to heated surfaces. If there is any movement available in the components, such as when applying solder to the ends of loose wires, it is exceedingly difficult to manually hold the components on the tip of the soldering iron and apply fresh solder at an appropriate location. Further, the internal temperature control of a soldering iron is often set to a temperature slightly above the melting temperature of common solder formulations. If contact between the hot tip of the soldering iron and the component is intermittent or imperfect, there is imperfect heat transfer and there ensues a constant fight to get all surfaces (e.g., wire ends, component leads) hot enough to encourage solder to melt and flow into desired locations. A significant amount of time can be needlessly consumed when multiple solderings must be performed due to repeatedly applying the soldering iron and manipulating moving components, finding a safe location to set down and pick up the soldering iron, and so forth.

Accordingly, there is an opportunity to improve soldering devices and facilitate holding in place wires, electronic components and the like in an appropriate orientation for applying heat and applying solder where desired.

SUMMARY

Embodiments and techniques described herein relate to providing mechanical arms, extensions or supporting structures for soldering devices.

One objective is to provide a bracket or a set of assembly components to affix or attach arms to an existing soldering device such as a soldering arm or soldering gun.

Another objective is to provide arms which extend beyond the tip of the soldering device so as to prevent the heated tip of the soldering device from undesirably contacting objects and surfaces in front of or proximate to the soldering tip.

Another objective is to provide structures to hold movable components tight against a heated surface of the soldering device so as to facilitate quick and efficient heat transfer to surfaces intended to receive solder.

Another object is to provide structures to facilitate adding solder to heated components in a single heating cycle and reduce the need for reapplying heat to nearby surfaces when manually soldering components.

Another objective is to provide a set of jaws, claws, tapered opening and the like to hold objects stationary relative to the soldering device tip.

Another objective is to free a hand for an operator so that the hand is free to apply fresh solder to heated objects and the soldering device tip.

Another objective is to create a soldering device that may be placed on a working surface without allowing the heated tip to laterally contact proximate objects or surfaces and to provide stability to an unattended soldering device so as to reduce the opportunity for the hot soldering to fall over and allow contact between a heated tip of the soldering device with proximate objects or surfaces.

Another object is to create assembly components including soldering arms which may be affixed to an existing soldering device without the need to disassemble or remove the assembly components when it is time to store the soldering device between soldering sessions.

Another object is to create an inexpensive set of components which may be easily assembled to a soldering device with as few tools as possible.

Another object is to create additional components or surfaces that are safe to grip with a bare hand when handling a heated soldering device.

This summary is provided to introduce a selection of concepts in a simplified form that are further described below in the detailed description. This summary is not intended to identify key or essential features of the claimed subject matter, and thus is not intended to be used to limit the scope of the claimed subject matter.

BRIEF DESCRIPTION OF THE DRAWINGS

While the appended claims set forth the features of the invention with particularity, the invention, together with its objects and advantages, is more readily appreciated from the following detailed description, taken in conjunction with the accompanying drawings. Throughout, like numerals generally refer to like parts. Unless specifically indicated, the components and drawings are not shown to scale.

DETAILED DESCRIPTION

Overview. The instant invention solves many of the shortcomings of current designs of soldering guns and soldering irons. Instead of a soldering stand or station, arms are mounted or make part of the soldering instrument to provide stand-like elements to the soldering instrument and to provide structural elements to position and hold components near the heated tip of the soldering instrument. The arms are particularly effective in reducing movement of components, such as when applying solder to the ends of loose wires.

Figure 1:
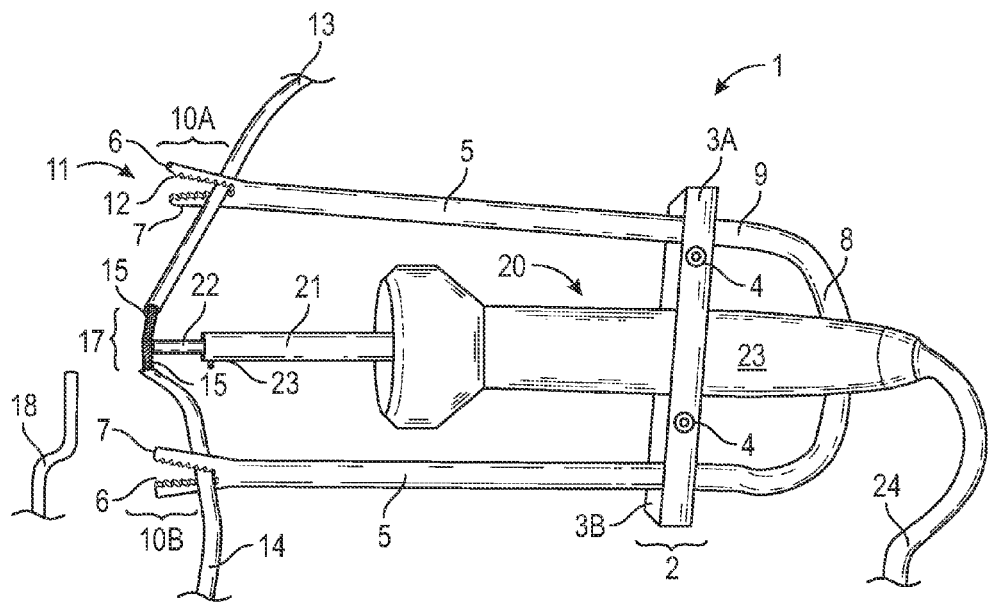
FIG. 1 is an overhead perspective view of a set of arms assembled to a soldering iron according to a first illustrated embodiment.

FIG. 1 is an overhead perspective view of a set of arms or safety arms assembled to a soldering iron according to a first illustrated embodiment. The overall arm assembly is generally designated as 1. With reference to FIG. 1, the arm assembly 1 includes a bracket assembly 2 which includes a top bracket component 3A and a bottom bracket component 3B held together by two fasteners 4. Other numbers of fasteners 4 are possible. While two substantially block-shaped bracket components 3A, 3B are shown, one atop the other, it is possible to have other types and shapes of bracket components that perform the functions of the components 3A, 3B. A single rod is bent to form two soldering arms 5, one on each side of the soldering iron 20. Alternatively, the soldering arms 5 may be formed two separate elements and mounted substantially similar to the configuration shown. Each soldering arm 5 passes through the lower or bottom bracket component 3B. The rod includes matching bends 9 to form a loop 8 around a back portion of the handle 23 of the soldering iron 20. The tip 22 of the soldering iron 20 is heated with electricity provided through the electric cord 24. The loop 8 can form a leg, support or rest for the back side of the soldering tool or soldering arm assembly 1. Additionally, the bottom bracket component 3B can provide a balancing or support structure to the arm assembly 1. While the arms 5 are shown as having a smooth, metallic surface, the arms may be made of any material and may be finished in any number of ways. For example, the arms 5 may be made of an iron- or steel-based metal. The arms 5 may be bare or may be coated with a heat resistant coating such as a synthetic fluoropolymer of tetrafluoroethylene, or another carbon or non-carbon-based coating. Such a coating, if applied, would facilitate working with components and would resist undesired heat transfer. Alternatively, the arms 5 may be made from a carbon-based material, an aluminum or aluminum composite material and would not be coated. Yet further, the arms 5 may be textured to provide increased gripping of components and improved tactile feedback when the assembly 1 is in use.

The respective working ends 10A, 10B of the arms 5 each include a set of claws—a non-axial claw 6 and an axial claw 7. The distance (not labeled) between the working ends 10A, 10B is shown as a fixed distance across the heating region 17 including the soldering iron tip 22. This distance in FIG. 1 is arbitrarily selected for purposes of illustration. The sizes of the various components of the arm assembly 1 may be varied with or without the use of tools to accommodate various geometries and sizes of various soldering irons 20 while still providing the benefits described herein. Incidentally, the arms 5 are each shown in a preferred implementation as circular or at least ovoid in cross sectional shape. However, other cross sectional shapes of the arms 5 may be implemented and such alternative cross sectional shapes may provide other benefits in certain circumstances and for certain applications. According to one alternative example, the arms are square or rectangular in cross section thereby providing a more relatively flat surface when the assembly 1 is set aside and placed at rest.

While not shown in FIG. 1, according to alternative implementations, instead of claws 6, 7 formed in the working ends 10A, 10B of the arms 5, additional elements may be affixed to the ends of the arms 5 such as enlarged claws, fingers, non-articulating or articulating jaws and so forth. These non-illustrated alternative working ends may be affixed by sintering, welding, brazing, gluing, apply epoxy, and so forth. However, it is noted that any components added to the arm assembly 1 also adds additional cost to the overall product and therefore the inclusion of such additional components would need to be considered against the increased cost of producing the arm assembly 1.

When the arm assembly 1 is attached to the soldering iron 20, the working ends 10A, 10B are placed reasonably close to the heated tip 22 of the soldering iron 20 to accommodate a variety of parts to be soldered. The claws 6, 7 form a tapered opening 11. The tapered opening 11 can accommodate various sizes of components to solder. As shown, the claws 6, 7 may have ridges 12 or teeth to facilitate gripping of a component within the tapered opening 11. The claws 6, 7 are shown as non-articulating elements, but could take the form of a clamp or spring-loaded assembly so as to forcibly grasp a respective element to be soldered. FIG. 1 illustrates a first wire 13 held by a first working end 10A, and a second wire 14 held in place by a second working end 10B. The wires 13, 14 are shown as insulated elements. Non-insulated wire ends 15, 16 are held on the heated tip 22 of the soldering iron 20 and are positioned to receive fresh solder which is shown in the form of solder wire 18. According to a preferred method of use, assuming the bare wired ends 15, 16 are rolled, twisted or entangled together, a single free hand can place the first wire 13 into the first working end 10A of a first arm 5, up, over and firmly onto the heated tip 22 at the end of the soldering iron barrel 21 and back down and into the second working end 10B of the second arm 5. Such arrangement holds a bit of tension in the wires 13, 14. If the working ends 10A, 10B required opening of articulating elements (e.g., a clamp, pincher) or if the working ends 10A, 10B were co-planar with the tip 22, then it would be more difficult to manipulate the wires 13, 14 with a single hand while presumably holding the soldering iron 20 with or without an arm assembly 1 in the other hand. Once the wires 13, 14 are placed over the soldering tip 22, and wedged in the working ends 10A, 10B, a user should have a free hand to grasp the solder wire 18 and apply the solder wire 18 to the heated tip 22 and exposed wire ends 15, 16 in the working zone or at the soldering target 17.

Figure 2:
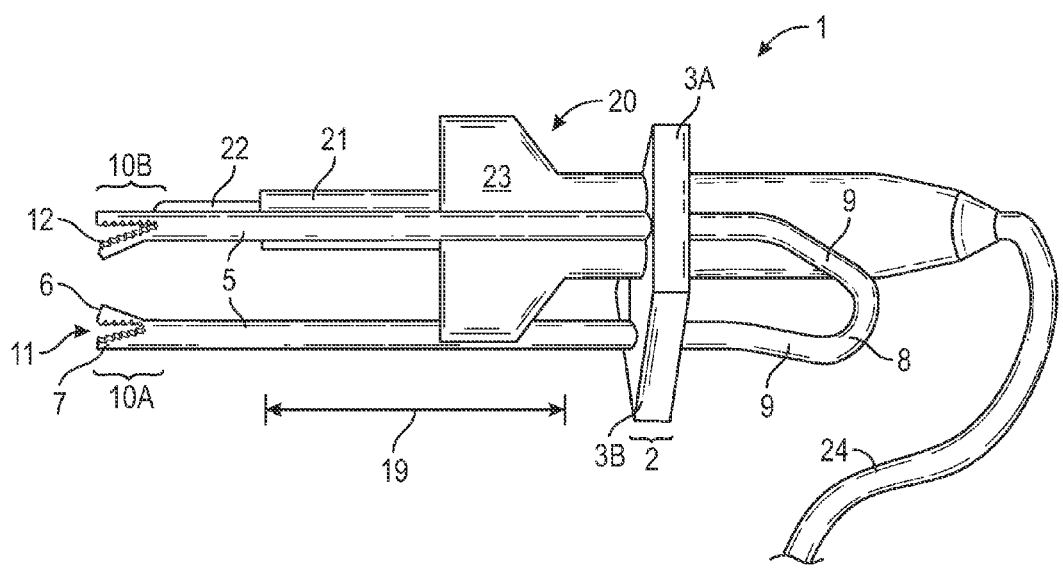
FIG. 2 is a side perspective view of the set of arms assembled to the soldering iron as shown in FIG. 1.

FIG. 2 is a side perspective view of the set of arms 5 assembled to the soldering iron 20 as shown in FIG. 1. With reference to FIG. 2, the wires 13, 14 and fresh solder 18 are omitted for sake of simplification of illustration. The working ends 10A, 10B are located coaxially along a horizontal axis 19 of the soldering iron 20 so that the working ends 10A, 10B are placed reasonably close to the heated tip 22 of the soldering iron 20. The ridges 12 are visible in the tapered openings 11. The size and spacing of the ridges 12 are selected so as to accommodate a variety of typically encountered components. In one implementation the ridges 12 are the width (and/or height) of a 12 gauge wire. According to a preferred implementation, the working ends 10A, 10B are formed into and from the rod that forms the arms 5 so as to keep manufacturing and assembly costs to a minimum. Preferably, the working ends 10A, 10B are placed so as to be slightly longer than or beyond the heated tip 22 of the soldering iron 20 so as to prevent unwanted touching of the heated tip 22 to surfaces directly in front of the soldering iron tip 22. The electric cord 24 provides energy needed to heat the soldering tip 22 via a heating element (not illustrated in this figure). In this way, heating and application of fresh solder is applied when desired and thereby provides an additional level of safety when working with the completed arm assembly 1. Further, the arms 5 and working ends 10A, 10B are configured and assembled in the bottom bracket component 3B so as to be in a plane that does not include the axis through the center of the soldering iron 20 and/or the axis through the center of the soldering tip 22. This configuration is shown schematically and with additional description in FIG. 4. When placed at rest on a surface (not shown), the arm assembly 1 rests either on a tripod defined by the working ends 10A, 10B and the bottom bracket component 3B of the bracket assembly 2, or on the combination of the bottom bracket component 3B and bottom edge of the arm loop 8 that passes under the handle 23 of the soldering iron 20, depending on the center of gravity of the assembly and arrangement of components. While a single bend 9 is shown in each arm 5 in FIG. 2 to accommodate the soldering iron handle 23, several bends may be made so as to provide additional shapes of the along the loop near the handle. When at rest, the assembly 1 maintains the heated tip 22 and barrel 21 off of a surface, which provides a measure of safety akin to placing the soldering iron 20 in a holder, stand or holster as is known in the art. Thus, the arm assembly 1 provides increased safety beyond the benefits provided by a soldering iron stand. The arm assembly 1, if left attached to the soldering iron 20, can also provide the convenience of always being assembled to the soldering iron 20 so as to offer the benefits of the arm assembly 1 during normal use including its safety benefits when the soldering iron 20 is heated. The arm assembly 1 is conveniently sized so as to take up approximately a similar amount of space as the unencumbered soldering iron 20.

Figure 3:
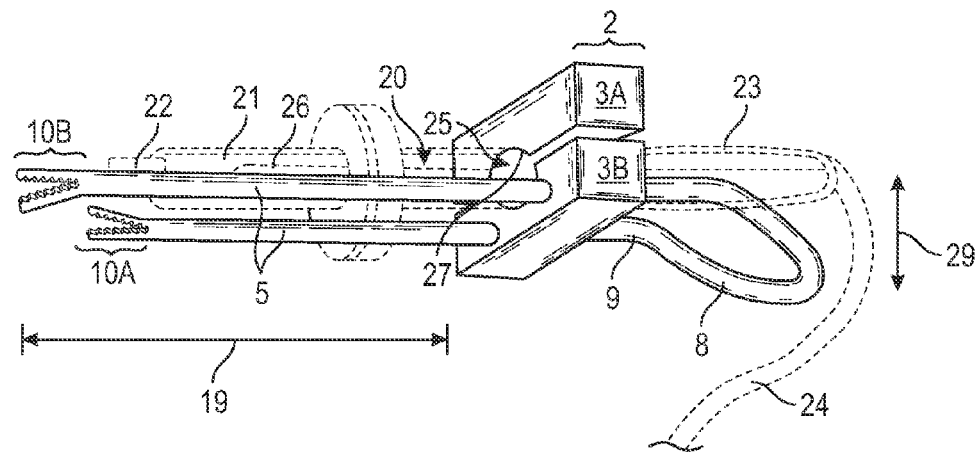
FIG. 3 is the side perspective view as shown in FIG. 2 with the soldering iron shown in silhouette.

FIG. 3 is the side perspective view as that shown in FIG. 2 with the soldering iron 20 and related components shown in silhouette. With reference to FIG. 3, the arm assembly 1 is shown assembled to the soldering iron 20. A passage or opening 25 in the bracket assembly 2 is visible and defined by a respective rounded or contoured surface 27 in the bracket components 3A, 3B. The respective contoured surfaces 27 and passage 25 accommodate the handle 23 of the soldering iron 20. In on embodiment, the surface 27 is coated with a material substantively different from the material of the bracket components 3A, 3B so as to provide an improved or increased gripping force or contact with the surface of the handle 23. The coating of the surface 27 may take the form of an additional element (not shown, but would substantially match the contours of the surface 27 shown) so as to provide a heat barrier between the bracket components 3A, 3B and the handle 23. The loop 8 formed by the bends 9 in the bar forming the arms 5 extends the bar vertically a distance 29 perpendicular to the length axis 19 that runs through the center of the respective arms 5 thereby providing another point of contact against a resting surface (not shown) when the assembly 1 is not in use in a user's hand. The electric cord 24 facilitates delivery of electric energy to the heating element 26 visible inside the handle 23 and barrel 21 of the soldering iron 20.

Figure 4:
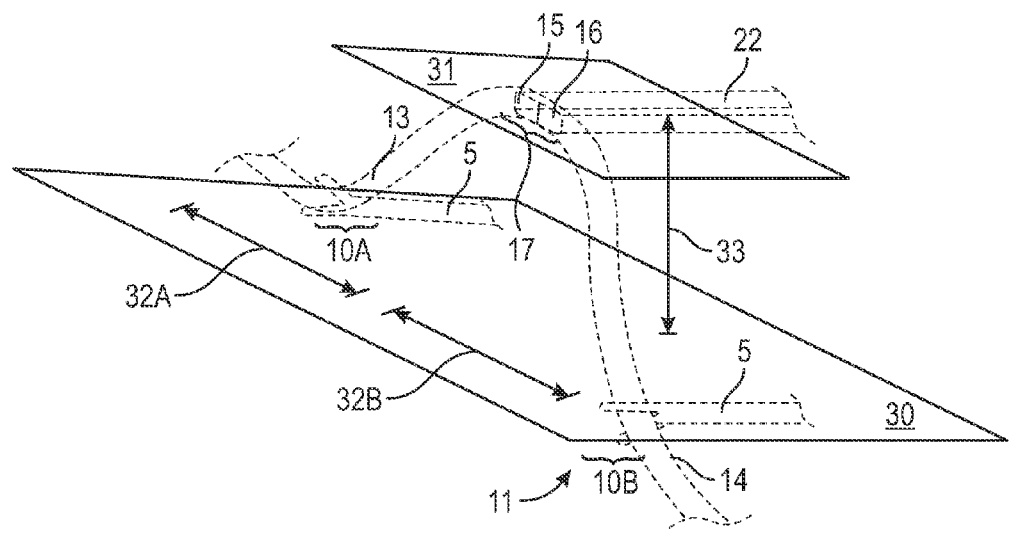
FIG. 4 is a perspective view illustrating orientation of components including arms and wires relative to the soldering iron tip.

FIG. 4 is a perspective view illustrating orientation of components of the assembly 1 and wires 13, 14 in their respective distinct locations as illustrated in FIGS. 1-3. With reference to FIG. 4, the arms 5 are vertically displaced a certain distance 33 from the heated soldering iron tip 22. That is, in particular, a first plane 30 is defined by the axes that pass through the center of the substantially parallel arms 5. While the arms 5 extend generally coaxially with the soldering iron tip 22, a second plane 31, one that includes the axis of the tip 22 and that extends parallel to the first plane 30, is displaced the vertical distance 33 relative to the soldering iron tip 22. In use, the first wire 13 is placed into the first working end 10A of the first arm 5, extended upward and against or over the end of the tip 22 of the iron 20 where the exposed, non-insulated wire ends 15, 16 are placed against the heated surface of the tip 22. The second wire 14 is extended down and placed into the tapered opening 11 of the second working end 10B of the second arm 5 thereby inducing a bit of tension in the stretch of wires 13, 14 held in such orientation. The wires 13, 14 and non-insulated wire ends 15, 16 are then held in appropriate places thereby freeing a user to apply fresh solder to the heated non-insulated wire ends 15, 16. A preferred vertical distance 33 between the arms 5 and tip 22 is at least one-quarter of an inch so as to provide a sufficiently large vertical air space or gap between a resting surface when the assembly 1 is not in use, a surface that would lie substantially at the location of the first plane 30. This relative positioning of the arms 5, working ends 10A, 10B, and heated tip 22 provide the benefits described herein. Further, each working end 10A, 10B of the arms 5 is displaced a respective horizontal distance 32A, 32B from a vertical plane (not shown) that contains an axis through the tip 22. The size of each of these horizontal distances 32A, 32B is at least such that there is a one-quarter of an inch air gap between surfaces so as to provide a sufficient distance for working with components relative to the arms 5 and the heated tip 22.

Figure 5:
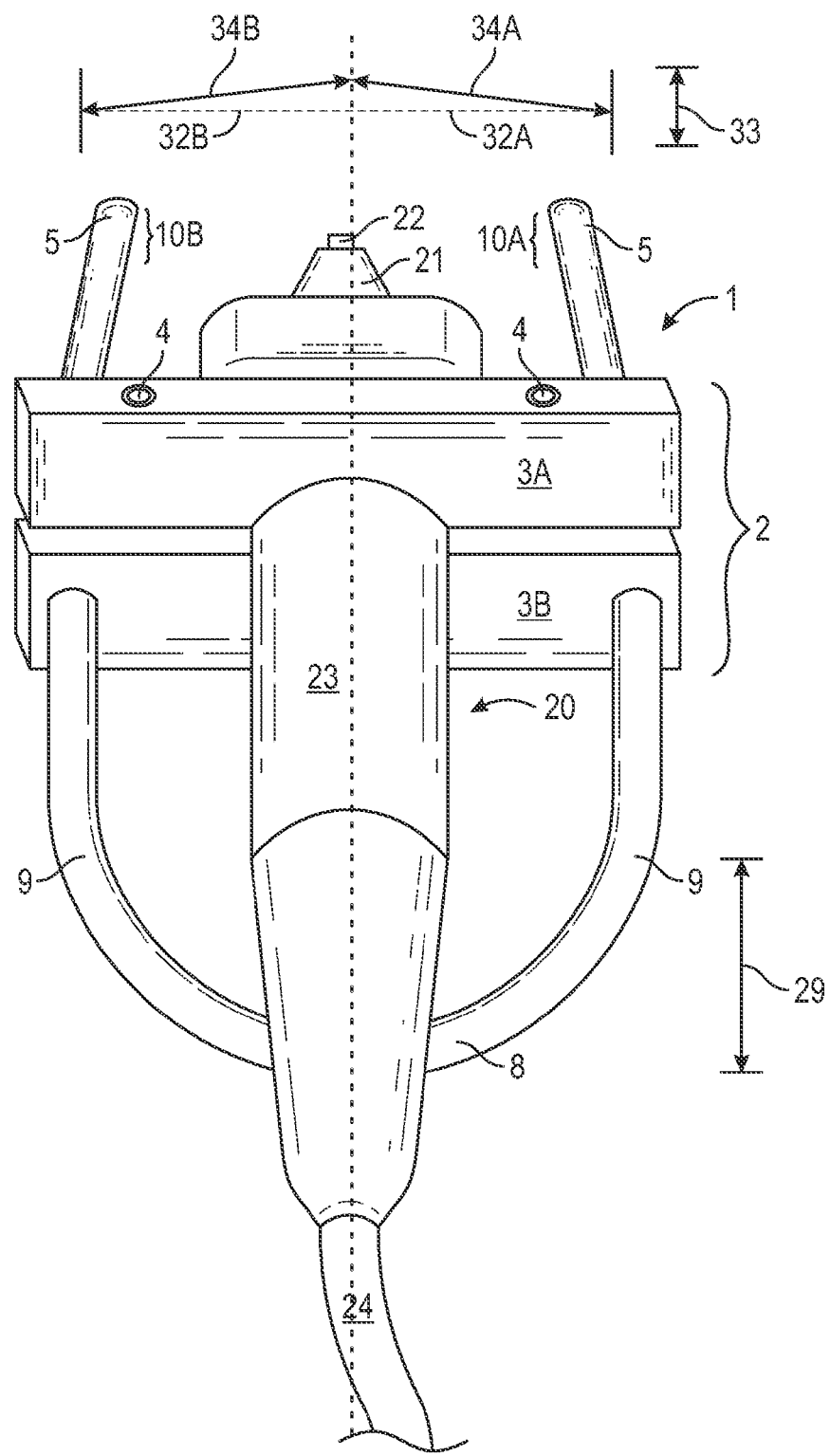
FIG. 5 is a perspective view of the assembled components of FIG. 1 shown from the back.

FIG. 5 is a perspective view of the assembled components of FIG. 1 shown from the back. With reference to FIG. 5, the assembly 1 includes arms 5 which pass substantially horizontally through apertures through the lower or bracket component 3B of the bracket assembly 2 which also includes the top bracket component 3A and recessed fasteners 4 embedded therein and holding the two bracket components 3A, 3B together. The first working end 10A lies at the distal end of the right arm 5. The second working end 10B lies at the distal end of the left arm 5. The arms 5 are made from a single rod that includes bends 9 to form a loop 8 that passes a vertical distance 9 under the handle 23 of the soldering iron 20 that is supplied with electricity through the cord 24. At the end of the barrel 21, the heated tip 22 is visible. The working ends 10A, 10B are each a respective horizontal distance 32A, 32B away from a vertical plane containing the axis defining the tip 22, the plane bisecting the soldering iron 20 in this view. The working ends 10A, 10B are each a respective vertical distance 33 away from a horizontal plane (not shown) containing the axis defining the tip 22. The axes defining the working ends 10A, 10B are each a respective distance 34A, 34B away from the axis defining the top 22. An arc may be measured between the two axes defined at the working ends 10A, 10B of the arms 5, preferably along the bottom or under side of the arrangement as shown in FIG. 5.

Figure 6:
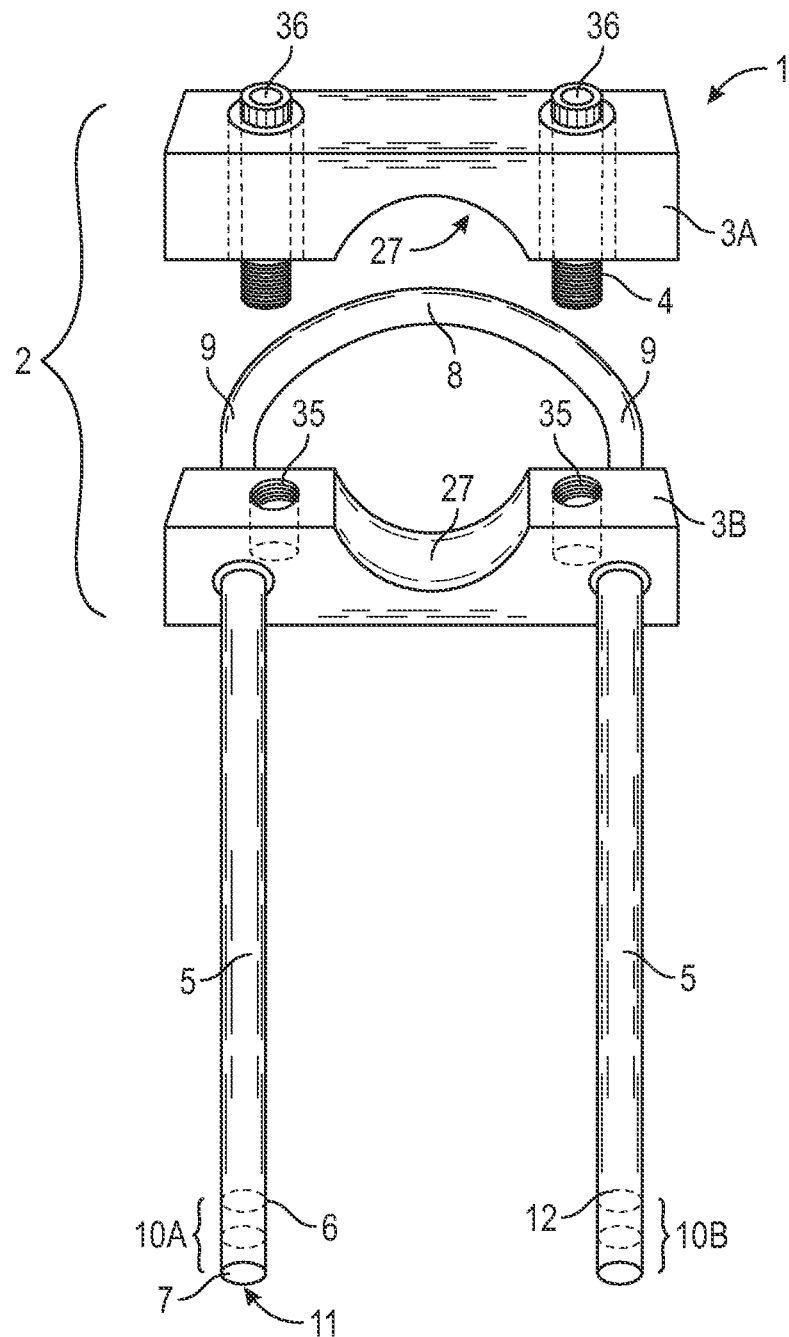
FIG. 6 is a front perspective view of the arm assembly alone and disassembled.

FIG. 6 is a front perspective view of the safety arm assembly 1 alone and disassembled. With reference to FIG. 6, the assembly 1 includes a rod-like structure forming two arms 5, each arm 5 passing substantially horizontally through a passage or aperture in the lower or bottom bracket component 3B. The size of the respective apertures is such as to permit the arms 5 to pass through the bottom bracket component 3B, but not to slide freely. Such sizing thereby keeps the proximal ends 10A, 10B substantially fixed relative to the front face of the bottom bracket component 3B and keeps these ends 10A, 10B fixed relative to the position of the tip of the soldering iron or device (not shown) mounted in the bracket 2 of the assembly 1. The rod-like structure includes two bends 9 that form a loop 8 that passes over or under a soldering device handle (not shown). The proximal ends of the arms 5 include a respective working end 10A, 10B. The working ends 10A, 10B each include a non-axial claw 6 and an axial claw 7. Alternatively, the working ends 10A, 10B each may include two non-axial claws 6. In either configuration, a tapered opening 11 is formed in the working ends 10A, 10B. Ridges 12, teeth or some form of coating or texture may be applied to or formed in the surfaces of the claws 6, 7. A cutout or semicircular contoured surface 27 is formed in each of the upper and lower bracket components 3A, 3B so as to accommodate a round or substantially round barrel-shaped handle 23 Visible in the upper bracket component 3A is a pair of threaded fasteners 4. The fasteners 4 pass through passages in the upper bracket component 3A. The ends of the fasteners may be inserted and turned into threaded recesses 35 which are formed in matching locations in the lower bracket component 3B. The heads 36 of the fasteners 4 may be hollow and formed so as to accept an Allen hexagonally shaped wrench such that, when the fasteners 4 are installed and the bracket components 3A, 3B are assembled, the heads 36 lie below the top surface of the top bracket component 3A thereby forming a flat, nicely finished top surface when the arm assembly 1 is affixed to the handle of a soldering iron or soldering device (not shown).

Figure 7:
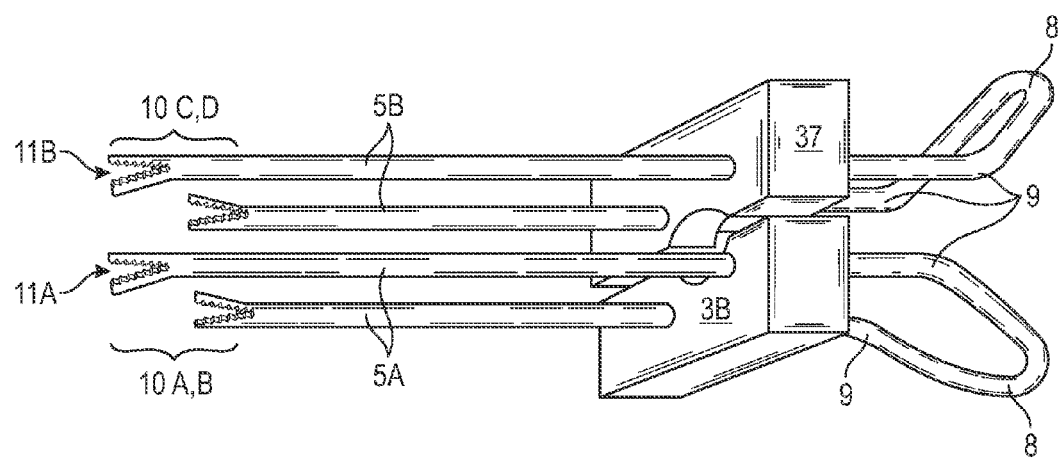
FIG. 7 is a side perspective view of a set of arms without being assembled to a soldering iron according to a second illustrated embodiment.

FIG. 7 is a side perspective view of a set of arms without being assembled to a soldering iron according to a second illustrated embodiment. With reference to FIG. 7, there are two arms 5A similar to those shown in FIGS. 1-3 and 5-6. There are two additional arms 5B which pass through a top bracket component 37 which has been modified to accept two additional arms 5B. The additional arms 5B pass substantially horizontally through the top bracket component 37 and extend to points above the tip of the soldering iron (not shown) as the first arms 5A extend to points below the tip of the soldering iron. The rod material of the top arms 5A have bends 9 which create a respective loop 8 in a top position similar to the one in the bottom position. The additional arms 5B each include a respective working end 10C, 10D. The first arms 5A end in working tapered apertures 11A. The second arms 5B end in working tapered working opening or apertures 11B. While the working openings 11B are shown in a substantially horizontal orientation like those of the first openings 11A, according to an illustrative implementation, the second apertures 11B may be formed with tapered apertures that are open in a substantially vertical orientation so as to accommodate working with wires and other components in a vertical orientation relative to the tip of the soldering iron thereby providing additional functionality depending on the nature of the soldering project to be completed.

Figure 8:
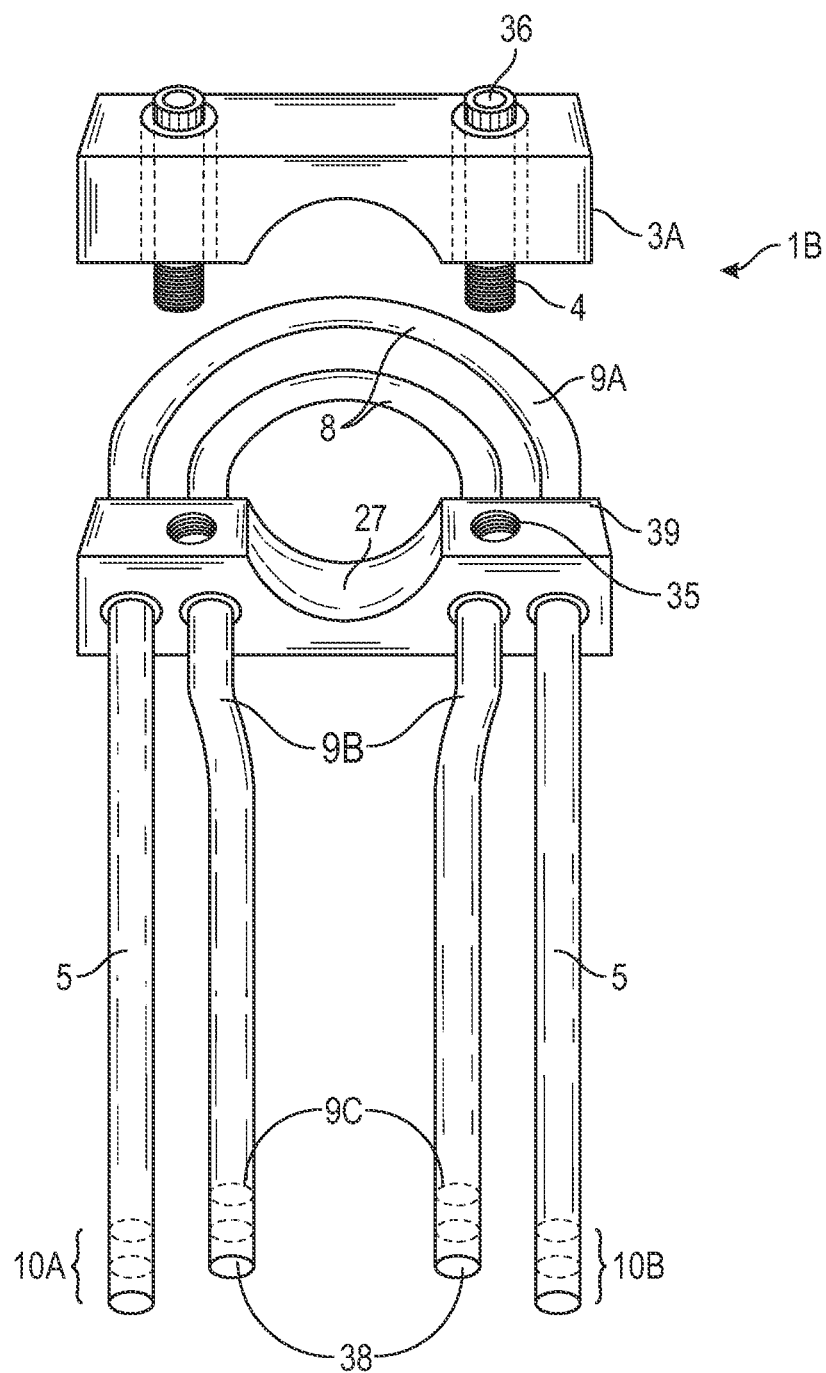
FIG. 8 is a front perspective view of a disassembled set of arms without being assembled to a soldering iron according to a third illustrated embodiment.

FIG. 8 is a front perspective view of a disassembled set of arms 1B without being assembled to a soldering iron according to a third illustrated embodiment. With reference to FIG. 8, each of the first pair of arms 5 is similar or identical to those shown in FIGS. 1-3 and 5-6. The arms 5 include a first pair of bends 9A which forms a loop 8 in the rod. There are two additional arms 38 which pass a bracket component 39 which has been modified to accept an additional rod bent into the configuration shown. The bar or rod includes additional bends 9B which provide arms 38 which are projected to and lie substantially parallel with a resting or proximal surface (not shown) that lies below a plane that is defined by the arms 5. This additional pair of arms 38 is meant to provide an additional height above the resting surface for working with the assembly when the assembly is attached to a soldering iron so as to maintain the heated tip of the soldering iron a substantially greater distance above the surface and to provide additional space for hands and components at the working ends 10A, 10B of the arms 5. The proximal ends of the additional arms 38 may include additional bends 9C so as to tilt the ends of the additional arms 38 away from the proximal surface so that the ends of the arms 38 do not gouge or mar the finish of the proximal surface.

Figure 9:
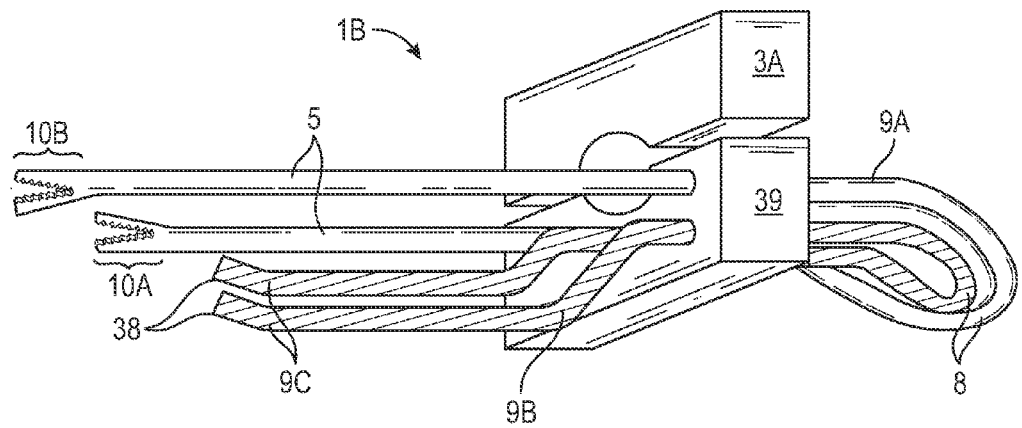
FIG. 9 is a side perspective view of the set of arms shown in FIG. 8.

FIG. 9 is a side perspective view of an assembly 1B including the set of arms 5, 38 shown in FIG. 8. With reference to FIG. 9, the second arms 38 lie below first arms 5. The first bends 9A form loops 8 in the rods. The second bends 9B bring the second arms 38 lower than the first arms 5. The additional bends 9C tilt the proximal ends of the arms 38 away from any surface that may contact the ends of the arms 38 thereby potentially protecting the surface from being marred by the assembly 1.

Figure 10:
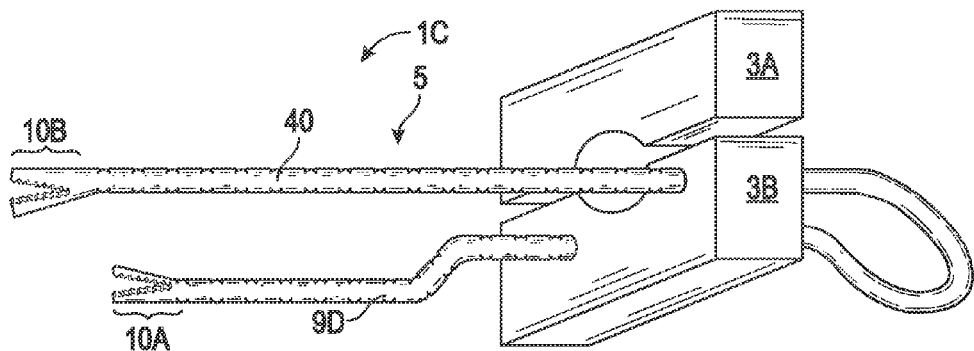
FIG. 10 is a perspective view of a set of arms with articulable joints according to a fourth illustrated embodiment.

FIG. 10 is a perspective view of a set of arms 5 with articulable joints according to a fourth illustrated embodiment. With reference to FIG. 10, along a portion of the length of the arms 5 between the bottom bracket component 3B and the working end 10A, 10B of the arms 5 are articulable joints 40. The top bracket component 3A is substantially similar to the others described in reference to other figures such as FIGS. 1-3. Each of these joints 40 allow each arm 5 to change direction along a certain short length of the arm 5. By combining bends, a desired overall bend 9D may be made which places a working end 10A, 10B at a desired location relative to the assembly 1C and relative to the soldering tip (not shown) of the soldering iron or soldering device to which the other components are attached. Each joint 40 is comprised of alternate ball and socket members such as the joints described in U.S. Pat. No. 4,949,927, which is incorporated herein by reference, along with the patents disclosed therein. The positions of the adjustable working ends 10A, 10B may be adjusted between each application of solder depending on the geometry of the particular component or location of components.

GLOSSARY 1 arm assembly
2 bracket assembly
3A, 3B bracket component
4 fastener
5 soldering arm
6 non-axial claw
7 axial claw
8 support loop
9 arm bend
10A, 10B working ends
11 tapered opening
12 ridges
13, 14 insulated wires
15, 16 uninsulated wire ends
17 soldering target
18 solder
20 soldering iron
21 barrel
22 soldering tip
23 handle
24 electric cord 25 opening in bracket
26 heating element
27 contoured surface
29 vertical displacement of loop
30 plane of arms
31 plane of tip
32A, 32B horizontal distances
33 vertical displacement of arms
34A, 34B distance between axes
35 threaded recess
36 fastener head
37 alternative top bracket
38 resting arms
39 alternative bottom bracket
40 articulating joints

CONCLUSION

In the previous description, for purposes of explanation, numerous specific details are set forth in order to provide an understanding of the invention. It will be apparent, however, to one skilled in the art that the invention can be practiced without these specific details. In other instances, structures, devices, systems and methods are shown only in block diagram form in order to avoid obscuring the invention.

Reference in this specification to "one embodiment", "an embodiment", or "implementation" means that a particular feature, structure, or characteristic described in connection with the embodiment or implementation is included in at least one embodiment or implementation of the invention. Appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

It will be evident that the various modification and changes can be made to these embodiments without departing from the broader spirit of the description. In this technology, advancements are frequent and further advancements are not easily foreseen. The disclosed embodiments may be readily modifiable in arrangement and detail as facilitated by enabling technological advancements without departing from the principles of the present disclosure.

I claim:

1. An arm and soldering device assembly, the assembly comprising:
   a soldering component, and wherein the soldering component includes a heating element, a soldering tip in connection with the heating element and a handle; and
   a bracket assembly attachable to the handle of the soldering component, the bracket assembly including:
      a first bracket component;
      a second bracket component, and wherein one of: (1) the second bracket component includes a contoured surface to accommodate the soldering component, (2) the first bracket component includes a contoured surface to accommodate the soldering component, and (3) both the first bracket component and the second bracket component include a contoured surface to accommodate the soldering component;
      a fastener that maintains the first bracket component in relation to the second bracket component and provides a force that maintains the bracket assembly attached to the soldering component;
      a first pair of arms formed from a metallic rod bent vertically in two locations to form a loop portion that passes around the handle, and wherein a distal end of each arm includes a tapered opening for receiving a component to be soldered by the soldering component, and wherein each arm passes through the either the first or second bracket component, and wherein each arm is held in place such that a distal end of each tapered opening is horizontally fixed in place away from and relative to the distal end of the soldering tip and wherein the distal end of each arm is vertically fixed away from and relative to the distal end of the soldering tip.

2. The arm and soldering device assembly of claim 1, and wherein each end of the first pair of arms includes a first claw that extends at an angle away from the axis of the arm and a second claw that extends coaxially with the axis of the arm, the pair of claws thereby forming the tapered opening for receiving an object to receive solder at the soldering tip.

3. The arm and soldering device assembly of claim 2, and wherein at least one of a pair of claws of each soldering arm includes ridges for providing improved gripping of the object to receive solder.

4. The arm and soldering device assembly of claim 1, and wherein the assembly further comprises:
   a heat-insulative element along one of: (1) the contoured surface of the second bracket component, (2) the contoured surface of the first bracket component, and (3) the contoured surfaces of the second bracket component and the first bracket component.

5. The arm and soldering device assembly of claim 1, and wherein the assembly further comprises:
   a second pair of arms formed from a second metallic rod, and wherein a distal end of each arm of the second pair of arms includes a tapered opening for receiving a component to be soldered by the soldering component, and wherein each arm of the second pair of arms passes through the second bracket component, and wherein each arm is held in place such that a distal end of each tapered opening is horizontally fixed in place relative to the distal end of the soldering tip and wherein the distal end of each arm of the second pair of arms is vertically fixed relative to the distal end of the soldering tip.

6. The arm and soldering device assembly of claim 5, and wherein the opening of the distal ends of the first pair of arms is substantially horizontal in orientation relative to the assembly, and wherein the opening of the distal ends of the second pair of arms is substantially vertical in orientation relative to the assembly.

7. The arm and soldering device assembly of claim 1, and wherein the assembly further comprises:
   a second pair of arms without openings in their respective distal end that are shaped with bends such that each arm extends substantially axially parallel with an axis that defines the soldering tip and which lie generally in a coplanar fashion vertically below a plain that includes the first pair of arms.

8. A soldering arm assembly comprising:
   a bracket attachable to a handle of a soldering iron, and wherein the soldering iron includes a tip that is heated with an electric element when electricity is applied to the electric element, and wherein the bracket includes a first bracket component and a second bracket component held relative to each other and to the handle of the soldering iron with two fasteners, and wherein one fastener is assembled to the bracket on each side of the handle of the soldering iron, the soldering iron being sandwiched between the first bracket component and second bracket component; and a rod bent in two locations to form a loop that passes under the handle of the soldering iron, and wherein each end of the rod is for receiving an object which receives solder at the tip of the soldering iron, and wherein each end of the rod is assembled to the bracket by being passed through a corresponding aperture formed in the first bracket component, and wherein each end of the rod extends coaxially with the soldering iron and extends proximate to the tip of the soldering iron, and wherein each end of the rod lies below a central axis of the tip of the soldering iron, and wherein each end of the rod lies lateral to the central axis of the tip of the soldering iron so as to provide a vertical and a horizontal distance that separate the ends of the rod from a surface of the top of the soldering iron.

9. The soldering arm assembly of claim 8, and wherein each end of the rod includes a first claw that extends at an angle away from the axis of the arm and a second claw that extends coaxially with the axis of the arm, the first claw and second claw thereby forming the tapered opening for receiving the object which receives solder at the tip of the soldering iron.

10. The soldering arm assembly of claim 9, and wherein an inside surface of at least one of the first claw and the second claw includes teeth for providing a more secure hold on an item placed in one or more ends of the rod.

11. The soldering arm assembly of claim 8, and wherein the ends of the rod extend beyond the end of the tip of the soldering iron.

12. The soldering arm assembly of claim 8, and wherein the ends of the rod are each open and wherein the opening is substantially horizontal in orientation relative to the assembly.

13. The soldering arm assembly of claim 8, and wherein each of end of the rod is coated with a heat resistant material.

14. The soldering arm assembly of claim 8, and wherein the rod is made from a steel-based material.

15. A soldering device comprising:

a soldering tip that is substantially cylindrical, and wherein a distal end of the soldering tip is tapered and serves as a working end for transferring heat and applying solder;

a heating element in thermal contact with a proximal end of the soldering tip, and wherein the heating element includes an electrical cord for attaching to a source of electricity for providing energy to the heating element;

a control circuit in electronic communication with the heating element, and wherein the control circuit includes a temperature sensor, and wherein the control circuit includes logical components for maintaining the heating element at a substantially constant temperature for melting solder; and a handle for the soldering device, and wherein the handle includes a surface that serves as a location to manually grip the soldering device for performing soldering operations, and wherein the handle includes two arms that are arranged and extend toward the soldering tip, one generally along each side of the handle, and wherein a first arm extends to a first position relative to the soldering tip and a second arm extends to a second position on the opposite side of the first arm relative to the soldering tip, and wherein each arm includes a distal working tip proximate to the working end of the soldering tip, each arm including a first portion that extends at an angle away from the axis of the arm and a second portion that extends coaxially with the axis of the arm, the first portion and second portion thereby forming a tapered opening for receiving an object for soldering.

16. The soldering device of claim 15, and wherein each working tip extends to a same distance as the distal end of the soldering tip.

17. The soldering device of claim 15, and wherein each working tip extends beyond a distance of the distal end of the soldering tip.

18. The soldering device of claim 15, and wherein each arm extends substantially parallel along a portion of the handle toward the soldering tip.

* * * * *